(12) United States Patent
Cole

(10) Patent No.: US 8,094,450 B2
(45) Date of Patent: Jan. 10, 2012

(54) GAMING MACHINE VENT COVER

(75) Inventor: Joseph W. Cole, North Las Vegas, NV (US)

(73) Assignee: Cole Kepro International, LLC, North Las Vegas, NV (US)

( * ) Notice: Subject to any disclaimer, the term of this patent is extended or adjusted under 35 U.S.C. 154(b) by 615 days.

(21) Appl. No.: 12/211,970

(22) Filed: Sep. 17, 2008

(65) Prior Publication Data

US 2009/0011839 A1   Jan. 8, 2009

Related U.S. Application Data

(63) Continuation-in-part of application No. 11/821,310, filed on Jun. 22, 2007, now Pat. No. 7,499,276.

(51) Int. Cl.
*H05K 7/20* (2006.01)
*A63F 13/08* (2006.01)
*H05K 5/00* (2006.01)

(52) U.S. Cl. .................... 361/695; 463/46; 454/184
(58) Field of Classification Search .................... 361/695
See application file for complete search history.

(56) References Cited

U.S. PATENT DOCUMENTS

| | | | |
|---|---|---|---|
| 5,167,104 A * | 12/1992 | Alvarado | 52/302.7 |
| 5,317,108 A * | 5/1994 | Prairie, Jr. | 174/67 |
| 5,417,433 A | 5/1995 | Phillips | |
| 5,775,987 A | 7/1998 | Brinket | |
| 6,152,451 A | 11/2000 | Bixby | |
| D439,931 S | 4/2001 | Yamaguchi | |
| 6,280,318 B1 | 8/2001 | Criss-Puszkiewicz et al. | |
| 6,439,992 B1 | 8/2002 | Demeter | |
| 6,491,298 B1 | 12/2002 | Criss-Puszkiewicz et al. | |
| 6,702,667 B2 | 3/2004 | Mattice et al. | |
| 7,036,027 B2 | 4/2006 | Kim et al. | |
| 7,238,104 B1 * | 7/2007 | Greenslade et al. | 454/184 |
| 7,241,222 B2 | 7/2007 | Cole | |
| 2006/0249896 A1 | 11/2006 | Yamazaki et al. | |
| 2006/0287111 A1 | 12/2006 | Mitchell et al. | |
| 2007/0060034 A1 | 3/2007 | Tanner | |

OTHER PUBLICATIONS

"Players Choice Drop-In Bar/ Slant Top", International Game Technology, published by IGT circa Oct. 1995, 2 pages.
"IGT:S-Plus Sant Top", International Game Technology, published by IGT circa Oct. 1995, 2 pages.

* cited by examiner

*Primary Examiner* — Gregory Thompson
(74) *Attorney, Agent, or Firm* — Weide & Miller, Ltd.

(57) ABSTRACT

A vent cover is provided for use with a gaming machine. The vent cover comprises a body for location over a vent in a housing of the gaming machine. The vent cover cooperates with the housing to define a vent space through which air flows to and from an interior of the gaming machine via the vent. The vent cover has air ports in communication with the vent space. The vent cover also has one or more drains which direct water from the vent space. The vent cover is preferably used with an exhaust vent of a gaming machine, directing heated air upwardly away from the gaming machine and preventing foreign material from entering the gaming machine through the vent.

7 Claims, 4 Drawing Sheets

GAMING MACHINE VENT COVER

RELATED APPLICATION DATA

This application is a continuation-in-part of U.S. application Ser. No. 11/821,310, filed Jun. 22, 2007 now U.S. Pat. No. 7,499,276.

FIELD OF THE INVENTION

The present invention relates to gaming machines and particularly to cooling systems and component for such machines.

BACKGROUND OF THE INVENTION

The gaming industry has experienced tremendous growth and increased popularity in recent times. As a result, gaming machines such as slot machines, video poker machines, and many of the new computerized multi-game machines have become extremely popular and are commonly the primary attraction for many gaming and entertainment establishments. These gaming machines are the subject of immense design efforts by game manufacturers which strive to develop new gaming machines that will attract players, encourage game play and maximize establishment profits.

In order to capture the public's interest and entice interaction with gaming machines, game manufacturers continually improve their gaming machines by incorporating newly developed technologies. The incorporation of these new technologies enables the gaming machine to provide an advanced gaming environment utilizing such improvements as enhanced graphics, multi-media content, interactive game play and more exciting games. For example, some of the more advanced gaming machines may employ more than one visual display for presenting multi-media content such as animations and video clips.

As these newer technologies have been utilized, traditional mechanical-type slot machines are frequently being replaced with new high-tech electronic gaming machines. These electronic gaming machines commonly utilize numerous internal electrical components such as a power supply, a visual display, a communication board, a sound system, a computer or controller, a printer, a currency acceptor and various card readers to name a few. One issue related to the implementation of these components is that they generate heat. If the components are not cooled adequately, the components may malfunction or prematurely fail. This issue of heat generation is even more pronounced relative to gaming machines because such machines are commonly always left "on" to attract players and take full advantage of the profit earning potential of the gaming machine.

In addition to incorporating new technologies into existing gaming machines, game manufactures strive to design smaller and more compact gaming machines. In today's gaming establishments, casino floor space is at a premium and is extremely expensive to develop. As a result, gaming establishments are motivated to optimize the casino floor space and thus maximize casino profitability by providing as many gaming machines as can physically be placed on the casino floor. Correspondingly, gaming machines that are smaller and more compact are favored by the gaming establishments. However, as the machines become smaller, the components therein are located closer together and it thus becomes increasingly difficult to cool those components.

The current techniques employed for thermal management have several disadvantages. For example, while natural convection of air through the gaming machine may be utilized, this air flow often proves inadequate to offset the rate of heat generation.

Another problem in designing cooling systems for gaming machines is associated with the need to protect the components within the gaming machine from access. First, the system must not allow a person to access the interior components, as such may compromise the security of the gaming machine and permit tampering. Second, the system must also not permit foreign objects or materials to enter the gaming machine which might affect the operation of the machine.

SUMMARY OF THE INVENTION

One aspect of the invention is an air flow vent configuration that prevents contaminants from entering an interior area of the gaming machine. Another aspect of the invention is a cooling configuration in which one or more air flow devices, preferably in the form of blowers, are utilized to move cooling air through a gaming machine. Yet another aspect of the invention is a vent cover for use with a gaming machine.

In one embodiment of a vent configuration, a gaming machine comprises a housing defining an interior area, the housing having at least one inlet vent and at least one exhaust vent. The vents permit air to flow to and from the interior area to an exterior of the housing. The at least one inlet vent has a duct extending into the interior area of the housing. The duct has at least one portion which slopes upwardly, whereby the duct is configured to prevent the flow of water or other material into the interior area. The cooling system further includes at least one exhaust vent having a duct extending into the interior area of the housing, where the duct has at least one portion which slopes upwardly, whereby the duct is configured to prevent the flow of water or other material into the interior area.

In a preferred embodiment, the one or more exhaust vents are located above the one or more inlet vents. The inlet and exhaust vents may be located at first and second opposing sides of the housing, in a back or other portion of the gaming machine housing. The at least one exhaust vent may have a substantially larger area than the at least one inlet vent. The at least one inlet vent may be coupled with a particle filter to prevent entry of various contaminants into the gaming machine.

In accordance with one embodiment of the invention, a gaming machine includes a cooling system. The gaming machine comprises a housing having one or more inlet vents through which air may enter the housing, and at least one exhaust vent through which air may be expelled from the interior area to a location exterior to the housing. The at least one exhaust vent is preferably located above the one or more inlet vents. The cooling system further comprises at least one air moving device having an inlet port located within the interior area of the housing, and at least one outlet port in communication with the at least one exhaust vent. The blower is configured to produce a substantial pressure differential between the inlet and the outlet ports. The blower draws air from within the interior area and expels it to through the at least one exhaust vent. This expelling of air causes air to be drawn though the one or more inlet vents into the interior area of the gaming machine. In one embodiment, the air moving device comprises a blower, and more preferably, a centrifugal-type blower.

Another aspect of the invention is a vent cover. The vent cover may be located over a vent of a gaming machine, such as an exhaust vent through a housing thereof. The vent cover comprises a body which cooperates with a mounting surface, such as the gaming machine housing, to define a vent space in communication with the vent. The vent cover also defines one or more air ports in communication with the vent space, permitting air to flow through the vent cover. In one embodiment, the air ports comprise slots located at a top portion of the vent cover. When located over an exhaust vent, the slots direct heated air upwardly away from the gaming machine.

In one embodiment, the vent cover also defines one or more drain ports. The drain ports may comprise openings at a lower or bottom portion of the vent cover. Water or other material which enters the vent space may drain there from through the drain ports.

The vent cover may comprise a unitary molded element comprising a non-planar face with a pair of sides. The vent cover may be configured to snap-fit or otherwise engage or mount to a surface, such as the housing of a gaming machine.

The vent cover serves to protect the gaming machine by limiting access to an interior thereof through the vent(s). In addition, the vent cover serves to improve cooling in the manner it directs air flow. The vent cover may be used with intake and/or exhaust vents. In addition, the vent cover may be used with a cooling system which includes one or more blowers in accordance with other embodiments of the invention, or with a cooling system which employs a standard fan.

Further objects, features, and advantages of the present invention over the prior art will become apparent from the detailed description which follows, when considered with the figures provided herein.

DESCRIPTION OF THE DRAWINGS

FIG. 5 is a cross-sectional view of the vent cover illustrated in FIG. 4 as mounted to a gaming machine having a fan configured to expel air there from.

DETAILED DESCRIPTION OF THE INVENTION

In the following description, numerous specific details are set forth in order to provide a more thorough description of the present invention. It will be apparent, however, to one skilled in the art, that the present invention may be practiced without these specific details. In other instances, well-known features have not been described in detail so as not to obscure the invention.

In general, the invention comprises one or more cooling components and systems, and methods of cooling. As one aspect, the methods, components and systems for cooling are configured to facilitate dissipation of heat from an interior of a gaming machine, including electrical components located therein.

One aspect of the invention is a cooling system which utilizes at least one positive pressure air flow device capable of moving high volumes of air. Another embodiment of the invention is a cooling system including one or more vents configured to prevent the entry of materials into the gaming machine. Yet another embodiment of the invention is a vent cover.

Figure 1:
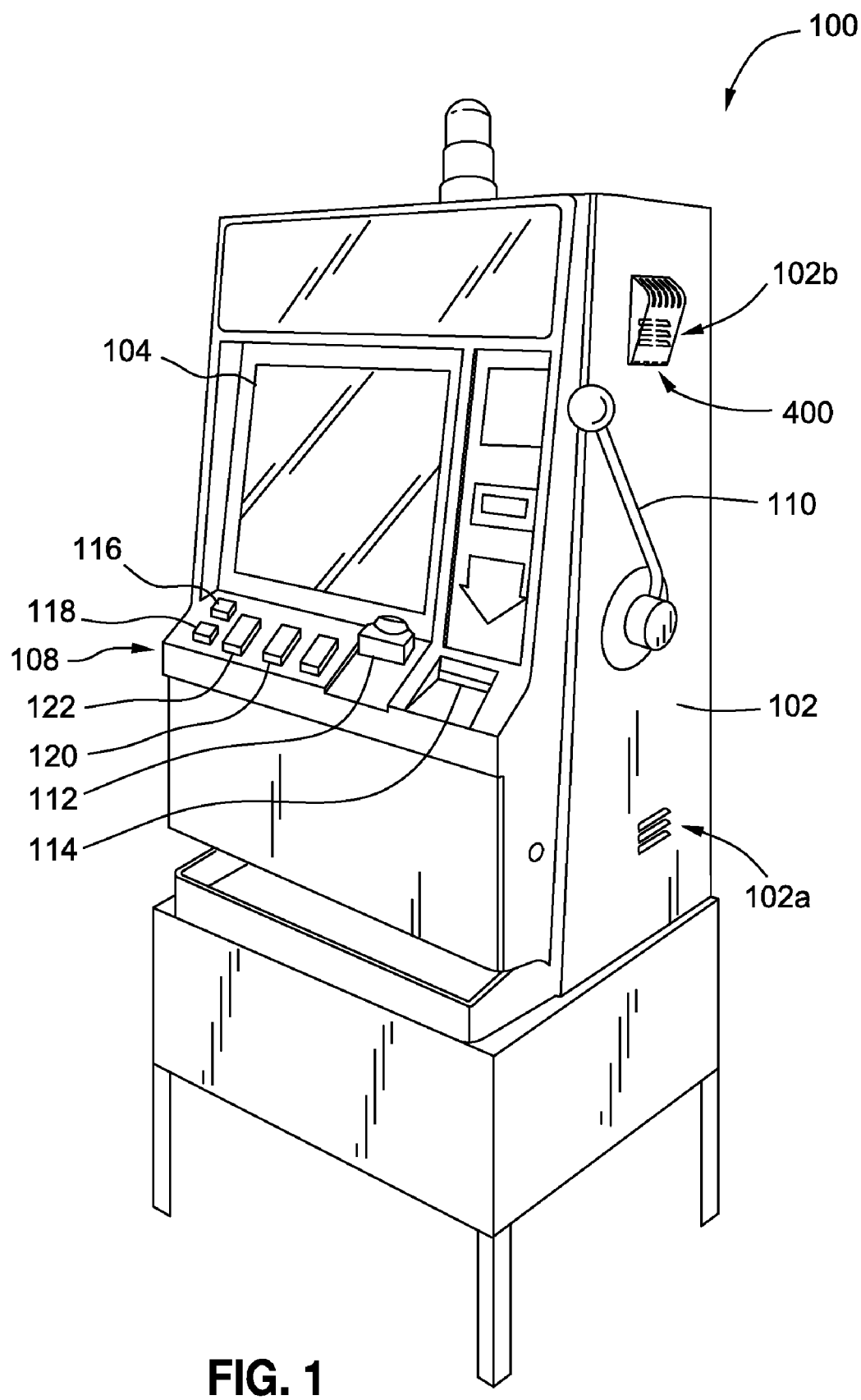
FIG. 1 is an isometric view illustrating a gaming machine having one or more features of the present invention.

FIG. 1 illustrates one embodiment of a gaming machine or device 100 to which the cooling system and method of the invention may be applied. As illustrated, the gaming machine 100 is positioned atop a support stand for convenient access by a player, but it may be mounted in a variety of manners. Preferably, the gaming machine 100 is a wager-based gaming machine configured to present one or more games to a player which offer the possibility of an award of winnings.

In one embodiment, the gaming machine 100 defines a generally enclosed interior space for housing one or more components. As illustrated, the gaming machine 100 generally comprises a housing or cabinet 102 for supporting and/or enclosing various components required for operation of the gaming machine. In the embodiment illustrated, the housing 102 includes a door located at a front thereof, the door capable of being moved between an open position which allows access to the interior, and a closed position in which access to the interior is generally prevented. The configuration of the gaming machine 100 may vary. In the embodiment illustrated, the gaming machine 100 has an "upright" configuration. However, the gaming machine 100 could have other configurations, shapes or dimensions (such as being of a "slant"-type or other configuration as is well known to those of skill in the art).

In order to facilitate the entry of air into the interior of the gaming machine 100 and to facilitate the exit of air from the interior of the gaming machine 100, the gaming machine may be configured with one or more air vents, ports or openings. As illustrated, an inlet vent 102a and an exhaust vent 102b are provided through one of the sides of the housing 102. These vents 102a, 102b provide a flow path through which surrounding environmental air may pass from the exterior of the housing 102 to the interior thereof, and from the interior of the housing back to the exterior thereof. It is contemplated that the gaming machine 100 may include vents in a variety of numbers and locations, as described in greater detail below.

The gaming machine 100 preferably includes at least one display device 104 configured to display game information. The display device 104 may be a mechanical, electro-mechanical or electronic display, such as one or more rotating reels, a video display or the like. When the display device 104 is an electronic video display, it may comprise a cathode ray tube (CRT), high resolution flat panel liquid crystal display (LCD), projection LCD, plasma display, field emission display, digital micro-mirror display (DMD), digital light processing display (DLP), LCD touchscreen, a light emitting display (LED) or other suitable displays now known or later developed, in a variety of resolutions, sizes and formats (e.g. 4:3, widescreen or the like). The display 104 may be capable of projecting or displaying a wide variety of information, including images, symbols and other indicia such as images of characters, places, card faces or other elements or information associated with game play, game promotion or other events.

The gaming machine 100 may be configured to present a wide variety of games. These may include video poker games, slot-type games, blackjack, bingo and bingo-based games, and other games now known or later developed. In one embodiment, certain game outcomes may be designed as winning outcomes. Awards may be provided for winning outcomes, such as monetary payments (or representations thereof, such as award of credits). As is well known in the art, the number of winning outcomes may vary dependent upon the desired payout or winning percentage offered to the players as compared to wagers that are retained by the gaming establishment.

The gaming machine 100 also preferably includes one or more player input devices 108 (such as a spin arm, control buttons, a touch-screen display, joystick, touch-pad or the like) that may be utilized by the player to facilitate game play. In one embodiment the gaming machine may be actuated by a mechanical linkage or electro-mechanical device associated with a spin arm 110, with movement of the spin arm (a "pull") by a player causes the gaming machine to commence game play.

Also included in the player input devices 108, is a means for accepting a wager or token representing monetary value. Illustrated in FIG. 1, a coin accepting mechanism 112 is provided for accepting coins as well as a currency or bill acceptor 114 is provided for accepting cash or paper currency. It is contemplated that other mechanisms may be provided for accepting a wager, such as credit card, ticket readers or input devices whereby a player may have funds paid from a remote account.

In one preferred embodiment, the gaming machine 100 includes a microprocessor or controller (not shown) for controlling the gaming machine, including receiving player input and sending output signals for controlling the various components of the machine 100 (such as generating game information for display by the display 104). The controller may be arranged to receive input in the form of a "spin" signal from a spin button 120 or the spin arm 110, a bet credit signal when one of the wager buttons 116,118 is depressed, and a currency insert signal when a player inserts bills or coins. The controller may be arranged to send signals for determining winning combinations, for causing the coin hopper/dispenser to pay winnings, and to cause a display to display winning amount information. In addition, the controller is preferably arranged to determine if a round of game play has resulted in a win, and if so, the amount to be paid to the player for that win.

The gaming machine 100 may be configured as a stand-alone device or be in communication with one or more external devices at one or more times. For example, the gaming machine 100 may be configured as a server based device and obtain game code or game outcome information from a remote server. The gaming machine 100 may also communicate with a remote accounting server and/or player tracking server, as is well known in the art.

In operation, the player may initiate game play by placing a wager. The wager is placed by activating one of the player input devices 108 such as a play one credit button 116 which places a single credit wager or a max bet button 118 which places a maximum wager for that round of game play. The maximum bet is commonly defined as playing or betting an amount comprising a multiple of the value of a single wager up to a predefined upper bet limit or threshold. When the player actuates either the play one credit button 116 or the max bet button 118, a wager in that amount is placed and the player's credit base is decreased by the number of credits wagered. The player's remaining credit base is typically displayed to the player by way of the display device 104. Upon placing a wager, the game may begin automatically or the player may initiate the game by activating another player input device such as spin button 120 or by pulling or actuating a spin arm 110. After activating the spin button/arm 120,110 the gaming machine 100 presents one or more game elements which are used to determine if the player has received a winning combination. The determination is preferably performed by a game controller which is discussed in greater detail below.

The gaming machine 100 generally includes a means for paying a player any winnings accumulated during game play. When a player wins a game, the player is preferably paid in the form of stored credits, the amount of which is indicated to the player on the display 104. A "cash out" button 122 is preferably provided for permitting a player to be paid the winnings or redeeming any credits initially paid into the gaming machine 100. The term "cash out" is used herein to define an event initiated by the player wherein the player receives a number of coins or currency that is equivalent to the value of the player's accrued credit base.

Typically when a player cashes out, the player receives either a paper currency voucher or currency in the form of a coin disbursement. If the player decides to receive a coin disbursement, the gaming machine 100 activates a coin hopper or coin handling device (not shown) which physically counts and delivers the proper number of coins to the player. The coin handling device is commonly configured to transport coins from a supply source (hopper or bin filled with coins) to a coin tray 124 or payout receptacle where the player physically receives the coins. The player might also elect to cash out by having a ticket or other media dispersed, such as via a printer 114.

It will be appreciated that the gaming machine just described and illustrated in FIG. 1 is only exemplary of a gaming machine to which the present invention has relevance. As indicated above, the gaming machine may have various configurations. In addition, the gaming machine to which the cooling system and method are applicable does not need to have the particular components described above or be configured to operate in the particular manner described above. For example, the gaming machine need not be configured as a wagering device or need not be configured to provide monetary or credit awards. For example, the gaming machine might award points or prizes.

Figure 2:
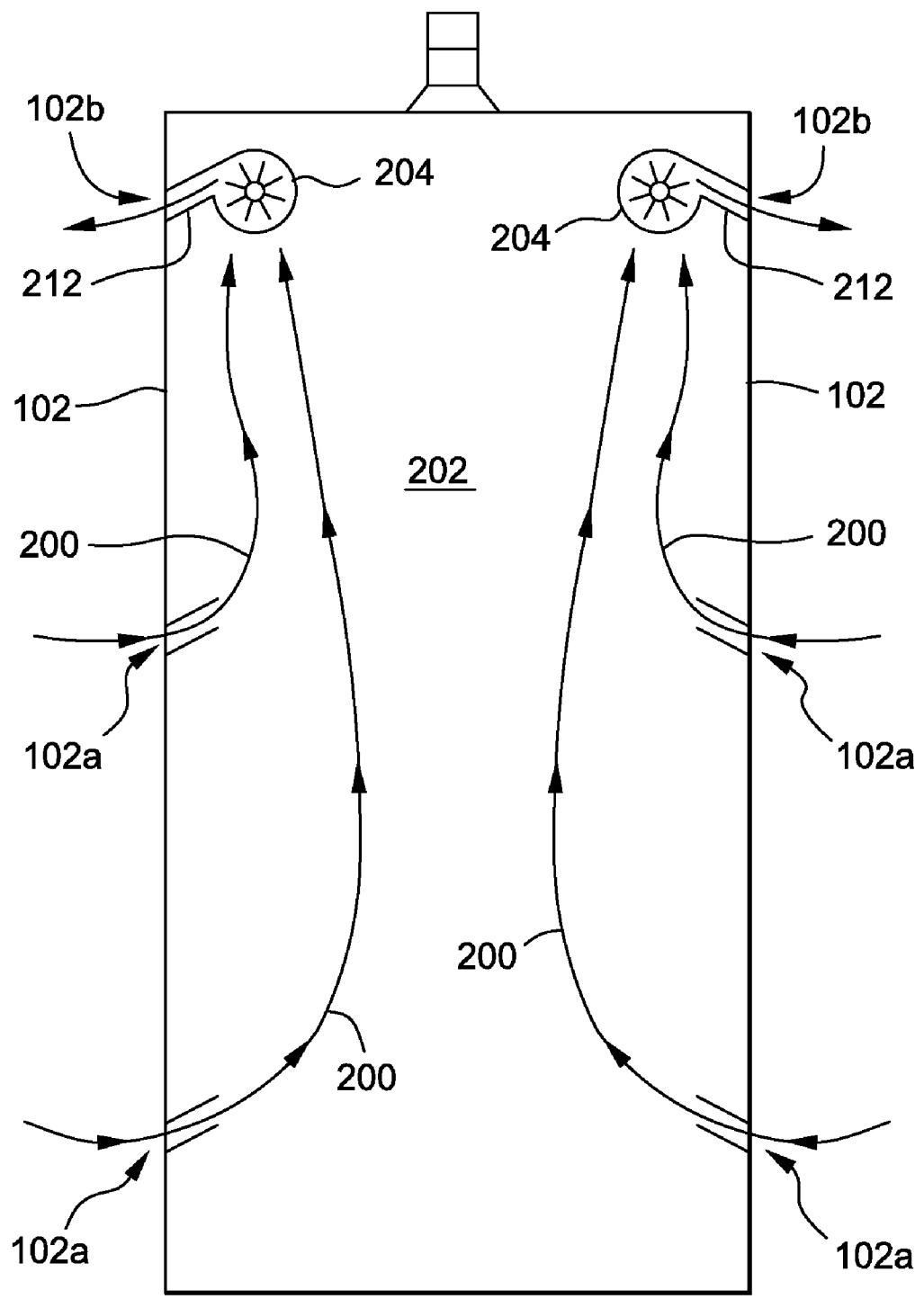
FIG. 2 is a front view of the gaming machine of FIG. 1 with the front door and the primary internal components removed, illustrating a cooling configuration in accordance with one embodiment of the invention.

One aspect of the invention comprises a cooling system and method. The cooling system and method have particular applicability to a gaming device or machine. Various aspects of the cooling system and method will be described with reference to FIGS. 2 and 3. FIG. 2 illustrates an interior portion of a gaming machine such as that illustrated in FIG. 1, without the various components thereof.

FIG. 2 illustrates various components of a cooling system of the invention, as well air flow paths or currents 200 in accordance with a method of use of the system. In one embodiment, the cooling system comprises one or more vents, ports or openings. Preferably, each vent defines a pathway through the housing or other portion of the gaming machine 100 from an exterior to an interior 202 thereof, through which air may pass. FIG. 2 illustrates a configuration in which the interior 202 of the gaming machine 100 comprises one generally open area. It will be appreciated that the gaming machine 100 might have more than one interior space, however, in which case the cooling system of the invention might be applied to each space or the various spaces might be linked with one or more air flow passages.

The vents may be configured to permit the flow of air in only one direction (such as by including a valve), or may permit air to flow in either direction. In a preferred embodiment, the vents may permit air to flow in either direction there through. However, the vents have been identified as "inlet/intake" or "outlet/exhaust" vents based upon the direction air normally or predominantly passes in accordance with the system and method. In particular, a vent is identified as an "inlet" or "intake" vent when the predominant direction of air flow is from an exterior of the gaming machine to the interior thereof, and as an "outlet" or "exhaust" vent when the predominant flow of air is from the interior to the exterior thereof.

In one configuration, as shown in FIG. 2, the cooling system includes four inlet vents 102a and two exhaust vents 102b. In a preferred embodiment, the inlet vents 102a are located below the exhaust vents 102b, and preferably in a location where air may flow into a bottom or lower portion of the interior 202 of the housing 102. Preferably, the exhaust vents 102b are located above the inlet vents 102a, and preferably in a location where air may be exhausted from a top portion of the interior 202 of the housing 102.

In one embodiment, the inlet vents 102a and exhaust vents 102b are located on each side of the housing 102. The number of inlet vents and exhaust vents may vary, as may their location, size and shape.

The cooling system includes a means for moving air such as an air flow device or air handler/mover. Preferably, the means for moving air is configured to move air at high volumetric rates and/or at positive pressure. In one embodiment, the means for moving air comprises at least one blower, and preferably a centrifugal or turbine type blower 204. Such blowers may have variety of configurations. In one embodiment, such a blower may comprise an impeller located in a housing, the impeller configured to draw air into the housing and expel that air back out of the housing, as described in more detail below.

One exemplary blower that is suitable for use with the present invention is produced by Pelonis Technologies Inc. of Malvern, Pa. The blower may be one selected from the Pelonis' RD9733 Series. The RD9733 series provides blowers having either ball or sleeve type bearing assemblies, air flow rates from about 14 to 22 cubic feet per minute (CFM), and a pressure differential from about 0.3 to 0.8 inches of water (in wg or in H20). This series of blowers further comprises a frame and impeller fabricated from reinforced plastic PBT, Class UL94V-0. The operating temperatures for these blowers are in the range of −10 to +70 degrees Celsius at 35-85% relative humidity. The blower uses a brushless DC motor with a permanent magnet to drive the impeller. Additionally, the blower may be configured with various options such as an auto-start feature which protects the bower if obstructed by a foreign object; a thermal speed control that adjusts fan speed according to temperature; a tachometer which informs the user of the blower running speed and/or an alarm which informs the user in the event of a fan failure.

In one embodiment of the invention, the cooling system is configured so that each blower 204 communicates with at least one, and preferably only one, exhaust vent 102b. Each blower 204 draws air from within the interior 202 of the gaming machine and expels it through the exhaust vent 102b to the exterior of the gaming machine. In this configuration, cooling air is drawn into the inlet vents 102a as a result of the reduced air pressure inside of the gaming machine. As the cooling air flows through the interior 202 of the gaming machine, as depicted by flow patterns 200, heat transfer takes place between the components located therein and the cooling air.

The cooler fresh air that is drawn into the gaming machine 100 extracts heat from the components by way of convection. Convection is the transfer of heat from a component at a high temperature to a surrounding fluid at a lower temperature by circulation/movement of the fluid with respect to the component. There are two primary types of convection, and the cooling system of the present invention advantageously employs both types in order to maximize cooling efficiency. First, natural convection is such as the air surrounding the hot components absorbs heat from those components, reducing the density of the air. The reduction in density causes the lower density air to be displaced by cooler air having a higher density. This exchange of high temperature-low density air with low temperature-high density air produces a natural convection current. In accordance with the cooling system, this convection current naturally causes the cooling air to move from the intake vents 102a upwardly through the interior of the gaming machine to the exhaust vents 102b. In addition, the one or more blowers 204 create forced convection by propelling the air. The one or more blowers 204 create an artificially induced convection current which enhances and increases the rate of heat transfer because there is more fluid flowing over the high temperature components in the machine.

Figure 3:
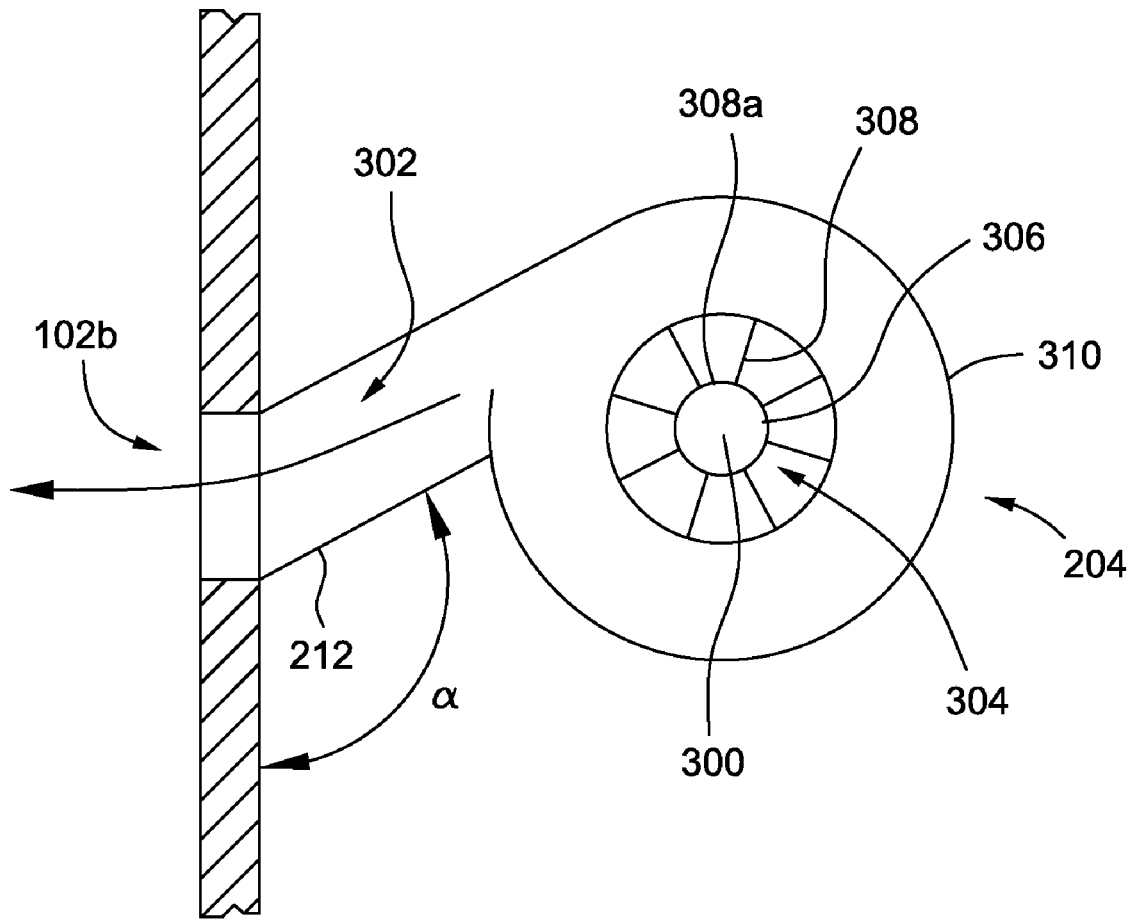
FIG. 3 is an enlarged detail view of an air flow device in accordance with an embodiment of the invention.

Reference is now made to FIG. 3, which is a detail view illustrating a centrifugal blower 204 associated with an exhaust vent 102b of an exemplary embodiment of the invention. The centrifugal blower 204 has a low pressure inlet port 300 and a high pressure outlet/exhaust port 302. In a preferred embodiment, the total pressure or pressure differential created by the blower 204 may be 0.1-0.5 inches of water gauge (in wg) or more. This contrasts substantially from axial fans typically used to move air relative to computing and gaming machines, which may generate a total pressure of only slightly above 0.0 in wg, such as 0.01-0.05 in wg (whereby the blower of the invention may provide a pressure differential of 3-10 times, or more, the pressure differential which may be achieved with the axial fan).

The centrifugal blower 204 has a moving vaned or bladed component, such as a squirrel cage and/or impeller 304. In one embodiment, for example, an impeller 304 may have a turbine configuration in which a turbine is mounted to a central shaft or mount 306, the turbine having a generally flat mounting surface with a plurality of vanes extending therefrom, such as in a spiral configuration. In the embodiment illustrated, the impeller 304 comprises a squirrel-cage type structure in which a plurality of vanes 308 extend outwardly from a central shaft or mount 306, the vanes 308 are aligned with one another in a generally circular path. In this configuration, air may be drawn into an opening 308a at the inside edges of the vanes 308, the vanes then expelling the air from at the outer edges thereof. One such squirrel cage configuration is illustrated and described in more detail in U.S. Pat. No. 4,738,593, which is incorporated by reference herein.

In one embodiment, the impeller 304 is contained within a blower housing 310 that defines at least one inlet or intake port 300 and at least one exhaust or outlet port 302. As a result of rotation of the impeller 304, air enters the one or more inlets. The vanes of the impeller 304 then centrifugally accelerate the air to the at least one exit or outlet port 302. As illustrated, the at least one outlet of the impeller 304 is preferably in communication with one of the exhaust ports of the gaming machine.

Another embodiment or aspect of the present invention is an air vent for a gaming machine. In one embodiment, the vent is configured to reduce or prevent the entry of material, such as water, into the interior of the gaming machine. In general, the vent includes an upwardly sloping section, such that gravity deters the flow of material through the vent.

Referring again to FIG. 2, in accordance with one embodiment of the cooling system, the inlet and exhaust vents 102a, 102b are configured with a duct or extension 212 that extends into the interior region 202 of the gaming machine 100. In general, the vents may comprise a rectangular cutout in a side of the housing, where the vents have a lower edge, an opposing upper edge, a first side and an opposing second side. In another variation, the vents may have a circular configuration with a circumferential edge. The duct 212 extends from that opening into the gaming machine. In one embodiment, at least a bottom or lowest portion of the duct 212 slopes or angles upwardly in one or more locations. For example, in FIG. 3 the lower portion of the duct 212 forms an angle α that is greater than 90 degrees. The upwardly sloping vent/duct configuration retards or prevents materials such as water or other contaminants from entering the interior of the gaming machine 100. In particular, this vent/duct configuration requires the contaminants to move or flow upwardly against the force of gravity (and in the case of the exhaust vents, the force of the exhausted air flowing through the vent/duct) to enter the gaming machine. It is contemplated that a particle filter may be associated with at least the inlet vents 102a to further reduce the introduction of solid contaminants, such as dust and dirt, from entering the housing 102.

It will be appreciated that the upwardly extending vent configuration may be accomplished in a variety of manners. As indicated above, it may be accomplished with a duct or flange. However, it might be formed via a conduit that leads from the opening in the housing. Such a conduit could be connected to the housing or actually comprise a portion of the wall of the housing. In one embodiment, the duct or conduit might extend inwardly and then rise upwardly or have other configurations whereby one or more areas prevent the flow of material through the vent/duct.

As indicated above, the centrifugal blower 204 is coupled with an exhaust vent 102b. As shown in FIG. 3, the blower outlet 302 extends to the duct 212 of the exhaust vent 102b. One important aspect of the preferred embodiment is that the flange/blower be configured such that entry of contaminants is prevented. This may be accomplished by mounting the centrifugal blower 204 such that any contaminants are deflected downward and out of the exhaust vent 102b. For example, the blower housing may be mounted to the duct 212 to produce an "alpha" angle that is greater than 90 degrees. As a result, if a contaminant such as water was directed into the exhaust vent 102b, the fluid is deflected and directed to flow outwardly from the gaming machine 100.

The centrifugal blower 204 may be coupled or mounted to the exhaust vent 102b in other ways. For example, the blower 204 may be integrally formed with an extension or duct and be mounted directly into alignment with the vent in an orientation such that the upwardly sloping configuration is achieved.

The blower outlet port 302 may be aligned with the duct 212 and/or exhaust vent 102b and structurally held in place by a bracket. The bracket may be mounted between the blower 204 and an interior portion of the gaming machine housing 102. It is contemplated that many various mounting configurations are possible that produce a downwardly sloping alignment between the blower outlet port 302 and the exhaust vent 102b and one of ordinary skill the art would inherently develop these variations within the spirit and scope of the presently disclosed invention. The blower 204 might also be connected to the vent via a conduit or other element(s) forming a close flow path.

In the embodiment illustrated, the gaming machine is provided with two exhaust vents 102b and a blower 204 associated with each exhaust vent. In other embodiments, there might be more than two exhaust vents 102b and or as few as one exhaust vent. Further, there may be a single blower 204 associated with one or more exhaust vents 102b. For example, the cooling system may use one or more inlet vents 102a and only one larger exhaust vent 102b having a single large centrifugal blower 204 coupled thereto. The use of a larger centrifugal blower 204 may substantially increase the volumetric air flow rate. It is contemplated that the sides of the gaming machine housing 102 may be configured with a plurality of smaller inlet vents 102a and the back of the housing may be configured with one large exhaust vent 102b.

As indicated, the gaming machine 100 may include four intake vents 102a. The number of vents may vary. Preferably, the number and size of the intake vent or vents 102a are selected to at least allow a volume flow of air to flow into the gaming machine 100 as the one or more blowers 204 of the cooling system can exhaust there from at maximum rate.

The vents may have other configurations. As illustrated, each vent is an opening in the housing. The opening could be located outwardly of the housing, such as at the end of a conduit or duct extending through the housing.

In another embodiment, the blower may be housed inside of an air intake plenum or chamber. The air intake plenum or chamber is generally a secondary enclosure located within the interior region of the gaming machine. The plenum/chamber has an opening on one side which encloses at least one blower and couples the blower's exhaust port with at least one dedicated exhaust opening of the plenum/chamber. The air intake plenum/chamber has a primary intake opening that is coupled with a fresh air inlet vent of the gaming machine. As a result of the blower(s) being enclosed within the plenum/chamber, fresh air is drawn into the plenum/chamber through the fresh air inlet vent and subsequently into the inlet of the blower(s). The air is then accelerated by the impeller of the blower(s) and exhausted through the blowers' exhaust port through the plenum/chamber exhaust opening and into the interior region of the gaming machine. The air intake plenum/chamber may be configured to prevent direct physical access into the interior region of the gaming machine. In this way, the plenum/chamber provides additional security for the gaming machine by preventing a player or person from inserting an object into the interior portion of the gaming machine by way of the air intake/exhaust vent. Of course, more than one blower may be associated with a single air chamber. In addition, in such a configuration, the air chamber may be configured so that the one or more blowers draw air from within the gaming machine and exhaust it through at least one exhaust opening of the chamber to a gaming machine housing exhaust vent.

As indicated, in the preferred embodiment, the one or more blowers (or other air moving devices) are located at the top of the gaming machine and expel air from the interior to the exterior of the gaming machine. As detailed herein, this configuration has a number of particular advantages. In some cases, a gaming machine may not permit location of the one or more blowers at or near the top of the machine. For example, in a bar top type gaming machine, various components of the machine may extend downwardly from the top thereof, thus interfering with the location of blowers except at the bottom of the machine. In such instances, the one or more blowers may be configured to draw air into the machine at the bottom and cause the cooling air to be forced through the machine to one or more air exhaust vents, such as near the top of the machine. An advantage of the configuration of the invention is that the one or more blowers create sufficient positive pressure to overcome the internal "impedance" of the machine (the interior pressure and air flow resistance) so as to create a very high air flow rate through the machine.

Another embodiment of the invention will be described with reference to FIGS. 1, 4 and 5. As illustrated therein, one aspect of the invention is a vent cover for use with a gaming machine. In general, the vent cover is configured to be located over one or more vents or other openings in a gaming machine. Preferably, the vent cover directs vented air to/from the gaming machine and/or serves to prevent the entry of foreign material, such as water, into the gaming machine.

Figure 4:
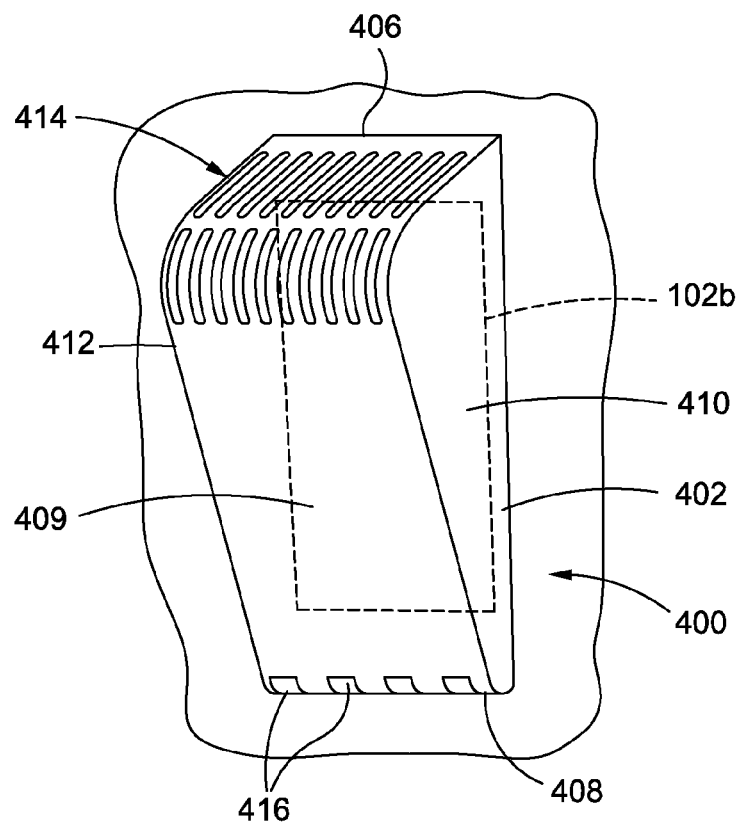
FIG. 4 is an isometric view of a vent cover in accordance with another embodiment of the invention.

Referring first to FIG. 4, a vent cover 400 comprises a body 402 which is preferably configured to be attached or mounted to a gaming machine. In one embodiment, the body 402 has a face 409. The body 402 has a top portion 406 and a bottom portion 408 which are substantially defined by the face 409. The body 402 also has a pair of opposing sides 410,412 which extend outwardly from the face 409. The body 402, and thus the face 409, has a front and a rear.

In one embodiment, the body 402 is configured to be mounted to a generally planar or flat surface, such as the exterior of a housing of a gaming machine. When so mounted, the face 409 extends outwardly from the mounting surface by varying distances. In particular, in one embodiment, the face 409 is somewhat convex in shape. As best illustrated in FIG. 4, the distance that the face 409 extends outwardly from the mounting surface increases from the bottom portion 406 towards the top portion 408 of the body 402, before decreasing at it extends back towards the mounting surface.

Preferably, the front of the body 402 is generally closed by the face 409. However, in that the face 409 is convex when viewed from the front, it is generally concave when viewed from the rear. The body 402 thus defines a generally open space or area behind the face 409 and the sides 410,412. As detailed below, when the body 402 is mounted to a gaming machine housing or similar surface, the body 402 cooperates therewith to define a vent space there between. Due to the changing distance of the face 409 from the housing, the depth of the vent space also changes. In particular, the vent space is deeper towards the top portion 406 than the bottom portion 408 of the body 402.

While the vent cover 400 is preferably configured in this manner, the vent cover 400 could have other configurations. For example, the face 409 could be planar and extend from the bottom portion towards the top portion of the body 402, where a top wall might extend from the face 409 back to the housing or other mounting surface (similar to the sides 410,412).

The shape of the vent cover 400 may vary. In the configuration illustrated, the overall foot-print of the body 400 is generally rectangular (i.e. the body 404 has a rectangular peripheral shape). However, it is possible for the vent cover 400 to have other shapes, such as round or the like.

While the vent cover 400 has been described as having portions or elements, this is for the sake of understanding. In fact, in a preferred embodiment, the vent cover 400 is molded as a single, unitary element. Of course, it is possible to manufacture the vent cover 400 as an assembly of one or more separate elements.

In one embodiment, the vent cover 400 is configured to mount to the generally planar exterior surface of a gaming machine. In such a configuration, the top portion 406 and bottom portions 408 of the body 402 as defined by the face 409, and the edge portions of the sides 410,412 form a generally flat or planar peripheral edge of the vent cover 400 for abutting the exterior of the gaming machine.

The vent cover 400 may be mounted to the gaming machine 100 in various manners. For example, in one embodiment the vent cover 400 may include one or more tabs. These tabs may engage mating apertures in the gaming machine. In other embodiments, the vent cover 400 might include one or more mounts, and fasteners might be extended through the housing of the gaming machine 100 and into engagement with the mounts. Of course other means or methods may be used to mount the vent cover 400.

In one embodiment, air is permitted to flow through the vent cover 400 from the vent space to and/or from a point exterior thereto. In one embodiment, the vent cover 400 comprises one or more air or vent ports 414. The ports 414 are preferably located near the top 406 of the face 409. The ports 414 may have various configurations. As illustrated, the ports 414 comprise elongated slots which extend generally parallel to one another and which are spaced along the face 409. The slots may have a narrow width dimension to prevent objects from being passed there through, but may have a long length dimension to create sufficient air flow area. Of course, the one or more ports 414 might have other configurations, including other shapes. In one embodiment, a screen or other element may be located behind the ports 414 to prevent passage of objects there through. In other embodiments, the body 402 might have two layers or members, each having ports 414 therein in offset manner, thus presenting a non-linear flow path through the vent cover 400.

In one embodiment, the vent cover 400 also includes one or more drains 416. Preferably, the drains 416 are located at the bottom portion 408 of the body 402. As illustrated, the drains 416 comprise openings in the face 409 along the bottom edge thereof. The drains 416 may comprise openings or slots in the body in various shapes. Preferably, the openings are relatively small, so as to prevent the passage of foreign objects there through.

Figure 5:
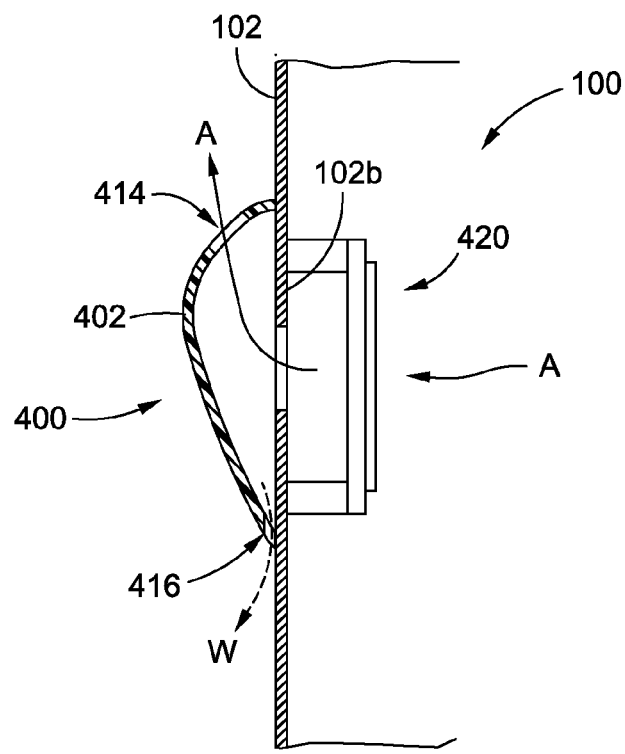

Additional aspects of the vent cover will be appreciated with reference to FIGS. 1 and 5. As illustrated in FIG. 1, the vent cover 400 of the invention may be located over a vent 102b of a gaming machine 100. Preferably, the vent cover 400 is mounted so that it cooperates with the housing 102 of the gaming machine 100 to define the vent space. This vent space is exterior to the housing 102 of the gaming machine 100, and behind the vent cover 400.

Referring to FIG. 5, in use, air A which exits the vent from the gaming machine 100 enters the vent space inside of the vent cover 400. The air A is routed so that it passes through the ports 414. In the preferred embodiment, this causes the exhausted air A to be routed generally upwardly, away from the gaming machine 100, as illustrated. Notably, exhausted air A tends to flow upwardly through the air ports 414 rather than through the drains 416 because the vent space narrows or constricts moving towards the bottom portion 408 of the vent cover 400. In particular, the exhausted air A tends to flow towards the area of least resistance/pressure, which is upwardly in the vent space to the air ports 414. In this regard, it is preferred that the flow area of the air ports 414 exceed the flow area of the drains 416 so that air tends to flow freely through the air ports 414 (to reduce back pressure and prevent substantial flow of air through the drains).

In addition, the vent cover 400 is configured to direct water or similar material away from the vent 102b. First, in the event water W is spilled, sprayed or is otherwise directed at the vent area of the gaming machine, the vent cover 400 deflects the material (since the body 402 of the vent cover 400 is generally closed and is positioned over the vent 102b) In addition, the material which does enter the vent cover 400 (such as through the ports 414) is routed back out of the vent cover 400. In particular, water W or other material is allowed to flow downwardly through the interior space and then drain out through the drain(s) 416.

As illustrated in FIG. 5, the vent cover 400 may be placed over a vent 102b having an associated air mover 420. Such a device may comprise a blower of the present invention. Alternatively, as illustrated, the device might comprise a simple fan or the like. The vent cover 400 can also be used with a vent having no associated air mover (where air moves through convection, for example, or where the air is pressurized on the intake end of the cooling system).

In one embodiment, the vent cover 400 is configured to be located over an exhaust vent 102b of the gaming machine 100. However, the vent cover 400 could be located over an intake 102a vent or both the intake and exhaust vents 102a, 102b or just one or more of such (but not all) vents of a gaming machine 100.

It will be appreciated that the vent cover 400 can be located over vents having a variety of configurations. For example, the vent could be a single large opening in the housing 102 of the gaming machine 100. The vent could also be one or more slots or other openings, as illustrated. In one embodiment, the vent cover 400 can be used with vents having features such as those of the invention (including sloping inlets/outlets) or other configurations.

As indicated, the features of the invention can be used alone or in combination. For example, the vent cover of the invention can be used with a gaming machine having a standard cooling system utilizing fans, or with the cooling system of the invention which utilizes one or more blowers. Likewise, the cooling system of the invention need not utilize the vent covers of the invention.

The cooling system of the invention has numerous advantages. First, one aspect of the invention is a gaming machine having a cooling system with vents which include at least one upwardly extending inlet or outlet section. In this manner, the vent or vents are configured to reduce the entry of contaminants into the gaming machine. For example, in the event water was to flow downwardly along the sides of the gaming machine, that water would be prevented from flowing into the interior of the machine through the vents.

Another aspect of the invention is a cooling system which takes advantage of both natural convention and positive air handlers/movers, such as by location of the intake and exhaust vents and the associated air movers.

Additionally, another advantage of one or more embodiments of the invention is a cooling system configuration wherein the coupling of an air flow device with an exhaust vent provides a high volume cooling system that is less noticeable to the player. By combining the blower with the exhaust vent, a negative pressure is developed within the gaming machine's interior area. As a result, air is drawn into the gaming machine through the inlet vents. The air is then expelled primarily through the exhaust vents. Correspondingly, any other openings in the gaming machine housing will have surrounding air drawn into the interior area due to the negative (low) pressure. For example, a small seam surrounding a button or display machine would function like a small inlet vent and the player would unlikely notice air being drawn into the gaming machine at these seams. Conversely, if the blower was associated with the inlet vent (i.e., the inlet port of the blower attached to the inlet vent) a positive (high) pressure would be developed within the interior area. In this case, the player would more likely notice the movement of air through the gaming machine because any seams would be blowing air outwards of the gaming machine and noticeably onto the player. Thus, a player would likely feel the positive pressure escaping from the gaming machine through any component that was not adequately sealed.

Yet another aspect of the invention is a cooling system which utilizes air movers which create a positive exhaust pressure. These air movers can be utilized to create a low air pressure condition inside of the gaming machine, resulting in a high cooling air flow into the gaming machine. In addition, these air movers exhaust air at sufficiently high pressure to overcome the air pressure outside of the machine, ensuring that high volumetric flow rates of air can be achieved.

Yet another aspect of the invention is a vent cover for a vent of a gaming machine. The vent cover may be utilized with an inlet or outlet vent of a gaming machine, such as the cooling system vents for such a machine. The vent cover serves to route air, preferably upwardly away from the gaming machine. The upward movement of the air aids in drawing air through the machine. In addition, the upward distribution of heated exhaust air serves to move the air away from the machine so that the heated exhaust air is not drawn back into the intake vent(s) of the machine (which would lessen the cooling effect).

In addition, the vent cover aids in preventing foreign material or objects from entering the gaming machine. For example, if water is directed at the machine, the vent cover obscures the vent(s) from direct access, reducing the probability that water will enter the vent. In addition, the vent cover in combination with the gaming machine vent preferably defines an indirect path into the gaming machine.

Another advantage of the vent cover is that it reduces or baffles fan and other noise associated with the cooling system. In current cooling systems, fans are generally mounted adjacent the vents, whereby fan noise is permitted to directly radiate outward from the machine. This creates undesirable noise to the players of that and adjacent gaming machines, distracting from the pleasant environment which the game operator desires. In accordance with the invention, however, noise which radiates outwardly from the vent is baffled or reflected by the vent cover. Some noise is directly dissipated by absorption of sound by the vent cover. Other noise (sound waves) is redirected or reflected upwardly, away from the gaming machine and the player thereof.

The vent cover of the invention also reduces static charge. Static charge is a threat to gaming machines, as such a charge may interfere with the proper operation of the electronics of the machine (even damaging them). A problem with existing gaming machines is that air is vented directly through an opening in the housing of the machine. In order to secure this opening from foreign objects, tampering and the like, a strong metal screen or mesh must be located over the opening. However, as vented air passes through the screen, the screen may develop a static charge which may be discharged to the components of the gaming machine (such as by passing from the metal screen through the metal housing to components of the machine). In accordance with the invention, the vent cover eliminates the need for such a screen, as the vent cover effectively secures the vent opening through the gaming machine housing, as detailed above. Thus, the risk of a static charge build-up on such a screen is eliminated. Also, because the vent cover is desirably a plastic or similar material, air passing through the vent cover does not result in a similar static charge.

It will be understood that the above described arrangements of apparatus and the method there from are merely illustrative of applications of the principles of this invention and many other embodiments and modifications may be made without departing from the spirit and scope of the invention as defined in the claims.

What is claimed is:

1. A gaming machine comprising:
   a housing defining an interior area having a number of gaming machine components located therein, said housing having an exhaust vent there through which permits air to flow from said interior area of said housing to an area external thereto, and said housing supporting at least one gaming machine display configured to display game information to a player; and
   a vent cover, said vent cover comprising a body having a top portion and a bottom portion, one or more air ports located in said top portion and one or more drains located in said bottom portion, said vent cover mounted to said housing over said vent and cooperating with said housing to define a vent space, a depth of said vent space at said top portion of said body being greater than a depth of said vent space said bottom portion of said body, whereby air may be exhausted from said interior of said housing through said exhaust vent into said vent space and from said vent space through said one or more air ports to an area external to said vent cover, and whereby water which enters said vent space may drain from said vent space through said one or more drains.

2. The gaming machine in accordance with claim 1 further comprising a fan located in said interior area of said housing in the location of said vent.

3. The gaming machine in accordance with claim 1 wherein said one or more air ports comprise one or more slots in said body.

4. The gaming machine in accordance with claim 1 wherein said one or more drains comprise one or more apertures in said body.

5. The gaming machine in accordance with claim 1 wherein said body comprises a face and a pair of sides, said face sloping outwardly away from said housing moving from said bottom portion to said top portion of said body.

6. The gaming machine in accordance with claim 1 wherein said body comprises a unitary element.

7. The gaming machine in accordance with claim 1 wherein said body defines a peripheral edge which contacts said housing around said vent space to generally seal said vent cover to said housing.

* * * * *